US005260009A

United States Patent [19]

Penn

[11] Patent Number: 5,260,009
[45] Date of Patent: Nov. 9, 1993

[54] SYSTEM, METHOD, AND PROCESS FOR MAKING THREE-DIMENSIONAL OBJECTS

[75] Inventor: Steven M. Penn, Plano, Tex.

[73] Assignee: Texas Instruments Incorporated, Dallas, Tex.

[21] Appl. No.: 905,069

[22] Filed: Jun. 24, 1992

Related U.S. Application Data

[63] Continuation of Ser. No. 648,081, Jan. 31, 1991, abandoned.

[51] Int. Cl.⁵ .................. B05D 3/12; B29C 41/22; B32B 31/00
[52] U.S. Cl. .................. 264/40.1; 118/100; 118/120; 118/313; 118/314; 118/323; 264/245; 264/246; 264/255; 264/308; 264/317; 364/468; 364/476; 395/119; 425/135; 425/150; 425/375; 427/356; 427/358; 427/421
[58] Field of Search .................. 264/40.1, 129, 134, 264/135, 139, 219, 221, 225, 226, 227, 245, 246, 255, 308, 317; 425/87, 90, 135, 150, 175, 176, 375, 458; 427/356, 358, 421; 118/100, 120, 300, 313, 314, 323; 364/468, 476; 395/119

[56] References Cited

U.S. PATENT DOCUMENTS

| 3,173,175 | 5/1958 | Lemelson . | |
|---|---|---|---|
| 3,616,495 | 4/1968 | Lemelson . | |
| 3,820,928 | 6/1974 | Lemelson | 425/146 |
| 3,875,275 | 4/1975 | Lemelson | 264/45.3 |
| 4,043,721 | 8/1977 | Lemelson | 425/116 |
| 4,120,922 | 10/1978 | Lemelson | 264/40.7 |
| 4,247,508 | 1/1981 | Householder | 264/219 |
| 4,285,903 | 8/1981 | Lemelson | 264/310 |
| 4,318,874 | 3/1982 | Lemelson | 264/40.1 |
| 4,474,861 | 10/1984 | Ecer | 428/614 |
| 4,571,319 | 2/1986 | Baluch et al. | 264/40.1 |
| 4,575,330 | 3/1986 | Hull | 425/174.4 |
| 4,641,270 | 2/1987 | Lalloz et al. | 364/476 |
| 4,665,492 | 5/1987 | Masters | 364/468 |
| 4,749,347 | 6/1988 | Valavaara | 425/135 |
| 4,796,194 | 1/1989 | Atherton | 364/468 |
| 4,929,403 | 5/1990 | Audsley | 264/129 X |
| 4,961,154 | 10/1990 | Pomerantz et al. | 395/119 |
| 4,978,493 | 12/1990 | Kersemakers et al. | 264/255 |
| 5,031,120 | 7/1991 | Pomerantz | 395/119 |
| 5,059,266 | 10/1991 | Yamane et al. | 156/64 |
| 5,134,569 | 7/1992 | Masters | 364/474.24 |
| 5,136,515 | 8/1992 | Helinski | 364/468 |

FOREIGN PATENT DOCUMENTS 284674 3/1987 European Pat. Off. .
322257 12/1988 European Pat. Off. .

OTHER PUBLICATIONS

"3D Modeler Models in Minutes", Advertisement by Stratasys, 1990.
"Make it in a Minute", Muraski, Machine Design, Feb. 8, 1990, pp. 127-132.
Deckard, C. R., "Solid Freeform Fabrication and Selective Powder Sintering", presented at Namracis, 1987.

Primary Examiner—Leo B. Tentoni
Attorney, Agent, or Firm—W. Daniel Swayze, Jr.; Richard L. Donaldson; Leo N. Heiting

[57] ABSTRACT

A method and process for computer-controlled manufacture of three-dimensional objects involves dispensing a layer of liquid, insoluble material onto a platform at predetermined locations, which then hardens. A second media, preferably water soluble, is then sprayed onto this layer to thereby encapsulate the hardened insoluble media. The uppermost surface of this encapsulant is planed, thus removing a portion of the encapsulant to expose the underlying insoluble material for new pattern deposition. After the resulting planing residue is removed, another layer of liquid, insoluble media is dispensed onto the planed surface. The insoluble media can be of any color and may vary from layer to layer, and from location within a layer to location within a layer. These steps are repeated, until the desired three-dimensional object, surrounded by a mold, is completed. At this point, the object is either heated or immersed in a solvent, thereby dissolving the mold and leaving the three-dimensional object intact. Other systems, methods and processes are also disclosed.

30 Claims, 9 Drawing Sheets

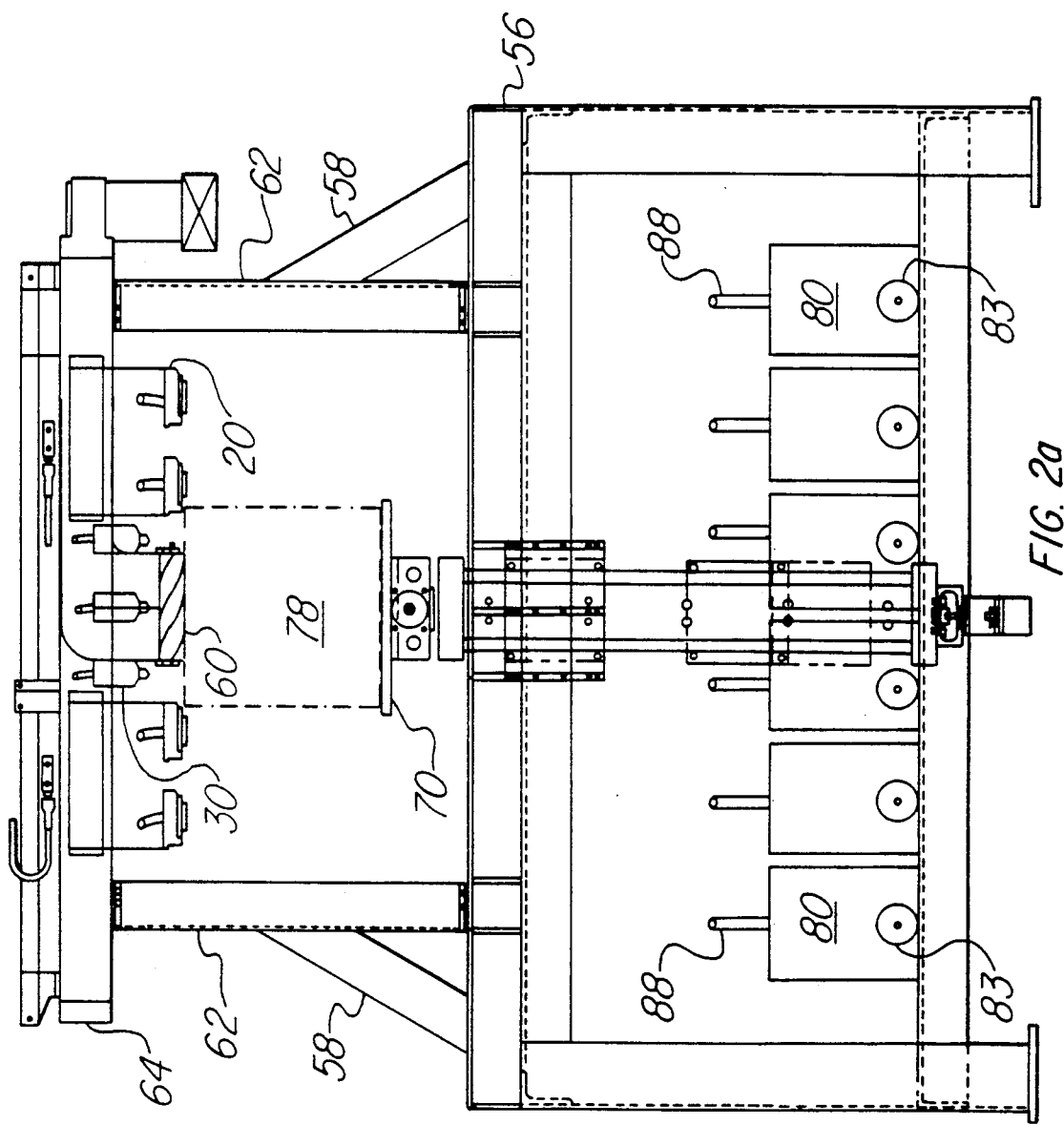

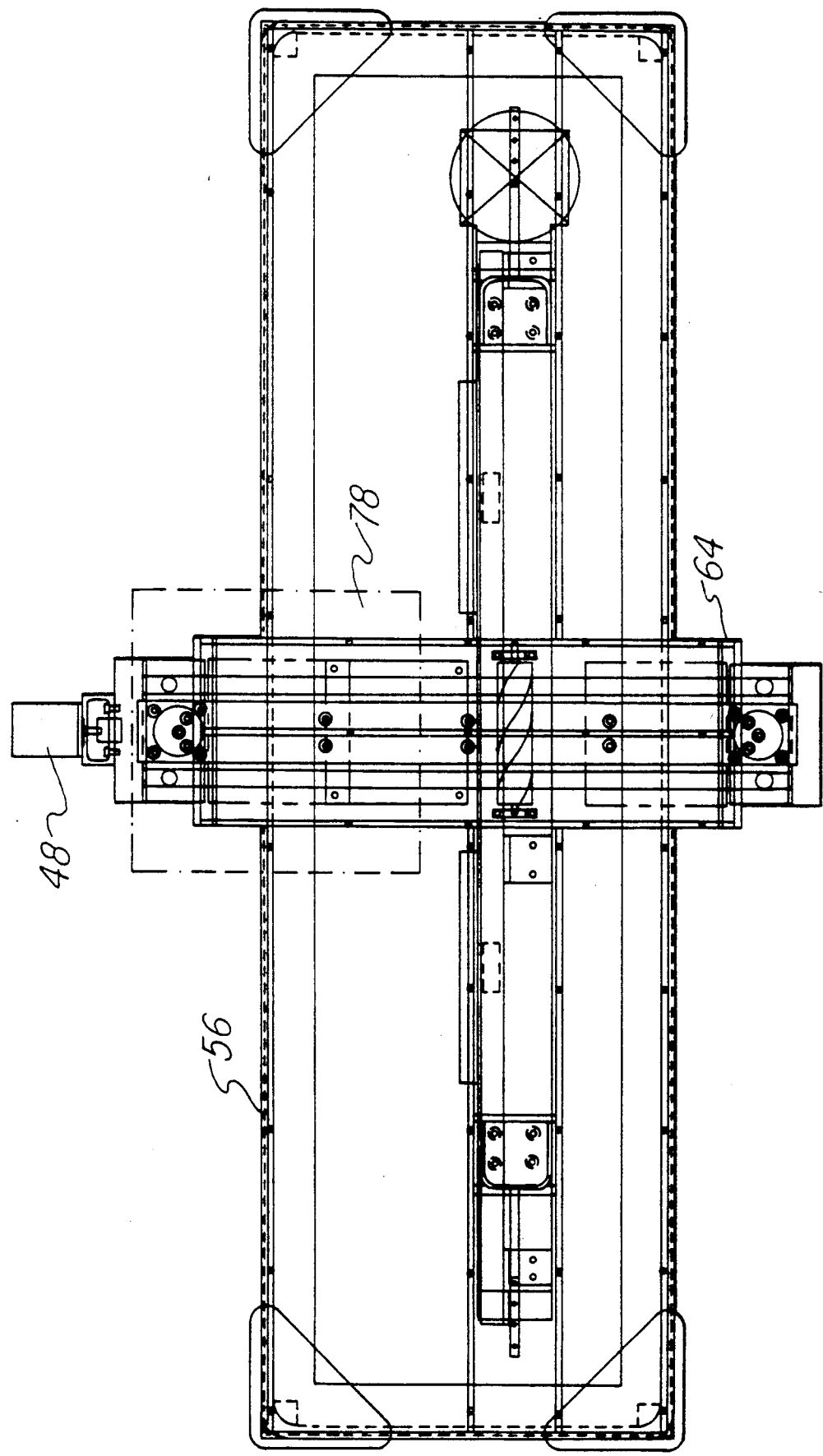

SYSTEM, METHOD, AND PROCESS FOR MAKING THREE-DIMENSIONAL OBJECTS

This application is a continuation of application Ser. No. 07/648,081, filed Jan. 31, 1991, now abandoned.

BACKGROUND OF THE INVENTION

1. Field of the Invention

Without limiting its scope, this invention relates to rapid prototyping, and more particularly to a system, method, and process for manufacture of three-dimensional objects from computer data using computer-controlled dispensing of multiple media and selective material subtraction.

2. Description of the Related Art

As complex designs increase the need for rapid prototype fabrication, this need for immediate feedback requires model or machine shops to fabricate complex parts in low volume with minimum setup and run-time. Most fabrication methods, however, are slow, complex, and expensive.

While manual machining and forming methods are often cheap and effective for simple designs, the costs can be prohibitive for the iterations required of complex parts and assemblies. Computer Numerically Controlled (CNC) machines are widely used to automate complex fabrication, but are costly to operate, maintain, and program just for one-of-a-kind production.

The most widely known system in the field of rapid proto-typing is stereolithography. This system fabricates complex parts from computer data by employing a set of computer-controlled mirrors to scan a laser beam across selected two-dimensional areas of liquid photopolymer contained in a vat and thereby form a layer of solid polymer. The cured layer, which is attached to a platform, is lowered into the vat and new layers are generated one on top of the previous layers to form a three-dimensional part.

When the part is complete, the excess resin is removed with a solvent and the platform attachment as well as all overhang supports are cut away from the desired object. Additional light exposure is required to solidify any trapped liquid.

A major drawback to stereolithography and similar approaches is that support structures must be designed to join the object to the platform and attach any overhangs, large spans or disjoint areas. The addition of these structures to the CAD model and subsequent manual removal from the part during cleaning is labor intensive and often requires special skills.

Another drawback is the additional occupational and environmental safety measures required with the use of lasers or resins. The chemicals used in this process and in cleanup require special handling, ventilation, and storage to protect the operator and the work place. High volumes of waste are generated in resin removal and cleanup. The photopolymer is expensive and non-recyclable. All of this makes installation in common work areas or offices impractical for size and environmental reasons. Furthermore, because of the delicate nature of lasers and optics, installation and calibration is very difficult. Maintenance is expensive due to system complexity and laser costs.

Another lithographic fabrication method is selective laser sintering. This method employs a heat laser to fuse (sinter) selected areas of powdered material such as wax, plastic, or metal. In practice, a vat of powder is scanned by the laser thereby melting individual particles which then stick to adjacent particles. Layers of the fused powder are processed sequentially like photopolymer lithography. An advantage of the sintering method is that the non-heated powder serves as a support for the part as it is formed. This means that the non-heated powder can be shaken or dusted off the object.

Selective laser sintering, however, is also a complex, expensive optical system. The resolution of the final part is limited by the beam diameter, which is typically 0.01"–0.02". Furthermore, in an additional step, the powder is deposited and levelled by a rolling brush which requires other electro-mechanical components. Unfortunately, levelling fine powders with a rolling brush often causes nonhomogeneous packing density. Additionally, while powder costs less (material & labor) than liquid photopolymer systems, preparing a 30 micron layer is difficult. An object built from this powder is of medium resolution, has a non-uniform surface and, often, a non-homogeneous structure.

Research has been conducted at the Massachusetts Institute of Technology in fabrication by three-dimensional printing. In this research, ceramic powder is deposited using a wide feeder over a vat or tray. A silica binder is then printed on selected areas of the powder to form a solid cross-section. The process is repeated to form a stack of cross-sections representing the final object.

This approach exhibits the same powder deposition problems as selective laser sintering, along with the additional difficulty in removing unbound powder from internal cavities. Furthermore, objects generated by this system are not recyclable. The MIT research is directed toward the production of ceramic molds. Metal or other materials are then injected or poured into the mold which is later broken away from the cast parts. Unfortunately, the mold's internal cavities, which define the final parts, are not easily inspected, which leads to an expensive trial and error process to acquire accurate parts.

Additional problems found with the art have been an inability to: provide for variable surface color or use more than one material media in the fabrication of the desired object; remove the media support for overhangs, large spans or disjoint areas automatically; or provide an automated system for physically reproducing three-dimensional computer designs and images. Systems currently available are expensive, the media they use cannot be recycled, and they cannot provide for automated part handling after fabrication due to their use of bulk powders and resins, which require containers rather than conveyor platforms. Accordingly, improvements which overcome any or all of these problems are presently desirable.

SUMMARY OF THE INVENTION

In view of the above problems associated with the related art, it is an object of the present invention to provide a computeraided manufacturing system, apparatus and a method for fabricating an object in more than one material media and/or in more than one surface color.

It is another object of the present invention to provide an automated system, apparatus and method for physically reproducing three-dimensional computer designs and images, including automated part handling after fabrication.

It is yet another object of the present invention to provide a system, apparatus and method for automatically removing the media support for overhangs, large spans, disjoint areas and the like from the fabricated object.

It is a further object of the present invention to provide a system, apparatus and method for fabrication of an object using recyclable media.

These and other objects are accomplished in the system, method, and process of the present invention. In preferred embodiments, a method and process for computer-controlled manufacturing of desired three-dimensional objects involves dispensing a layer of liquid insoluble material onto a platform at predetermined locations. This liquid media hardens once it contacts the platform. Although using a water soluble platform is preferable, the platform can be permanent without violating the spirit of the invention.

A water soluble media is then sprayed to encapsulate the hardened insoluble media. This water soluble media also hardens on contact. The uppermost surface of this encapsulant is planed, thereby removing a portion of the water soluble encapsulant to expose the underlying insoluble material for new pattern deposition. The resulting residue from such planing is removed and another layer of liquid insoluble media is dispensed onto the planed surface. These two-dimensional spray patterns are printed sequentially or "stacked" to form a three-dimensional object surrounded by a water soluble mold. This cycle of dispensing of a liquid insoluble media layer and water soluble encapsulant layer, followed by planing and removal of planing residue is known as a print cycle and continues until the three-dimensional object is completed. At this point, the object is immersed in water, thereby dissolving the water soluble mold, leaving the three-dimensional object intact.

According to another preferred embodiment a system for manufacturing three-dimensional objects from computer data comprises at least one object scanning and image capture device used to generate and store specific data about a desired three-dimensional object. This data is sent to a microprocessor control system which processes the received data into sequential cross-sections of the three-dimensional object to be physically rendered.

At least one dispensing device sprays a layer of at least one eutectic material in predetermined areas on a target surface and at least one nozzle sprays water soluble material to encapsulate the layer of eutectic material based on input from the microprocessor control system. The exact positioning of the sprayed materials is determined by not only the pattern received from the CAD system, but also by a set of linear positioning devices that move the at least one dispensing device, the at least one nozzle or the target surface according to instructions received from the microprocessor control system.

Once a layer of eutectic material is encapsulated with the water soluble material, a microprocessor-controlled cutting device planes the encapsulated material to expose the underlying eutectic material, while a microprocessor-controlled vacuum fixture removes the unwanted planed material. When all of the print cycles are finished, the completed object and mold are immersed in a support removal system employing water, thereby dissolving the water soluble mold and leaving the three-dimensional object intact.

A major advantage to the system and process of the present invention is that selected layers of liquid insoluble material, and even selected locations within a layer, can be colored differently than the remaining layers of liquid insoluble material, thereby allowing for a full range of colors and everything from subtle shading to abrupt changes of color within the same manufactured object. This aspect makes it possible for quality, detailed visualization models to be manufactured for a wide variety of uses such as scientific, medical, and geological study, to name a few. Furthermore, by using more than one type of insoluble material, varying textures can be achieved as well. Also, by judicious selection of the insoluble media, such as wax, thermoplastic, etc., and the use of water soluble media for a mold, the mold media and object itself is recyclable.

These and other features and advantages of the invention will be apparent to those skilled in the art from the following detailed description of a preferred embodiment, taken together with the accompanying drawings, in which:

DESCRIPTION OF THE DRAWINGS

FIGS. 2a-c are front, top, and left side views of another preferred embodiment of the rapid prototyping system of FIG. 1a according to the present invention;

Corresponding numerals and symbols in the different figures refer to corresponding parts unless otherwise indicated.

DETAILED DESCRIPTION OF A PREFERRED EMBODIMENT

The present invention fabricates exact copies of a CAD model without tooling and can operate in an ordinary work environment because it is environmentally safe.

Whenever CAD images are referred to herein, it should be understood that images from other object scanning and image capture devices can also be fabricated to scale using the present invention. Without limiting the scope of the present invention, examples of such devices commonly used include computer-aided design (CAD), computer-aided manufacturing (CAM), computer-aided engineering (CAE), computer tomography (CT), magnetic resonance imaging (MRI), positronic emission tomography (PET), laser profilers, confocal scanning microscopy (CSM), IR imagers, electron microscopy, etc. In this fashion, an innumerable variety of subjects, including models of living creatures or plants, and even celestial bodies can also be objects reproduced in color with this invention.

Figures 1A, 1B:
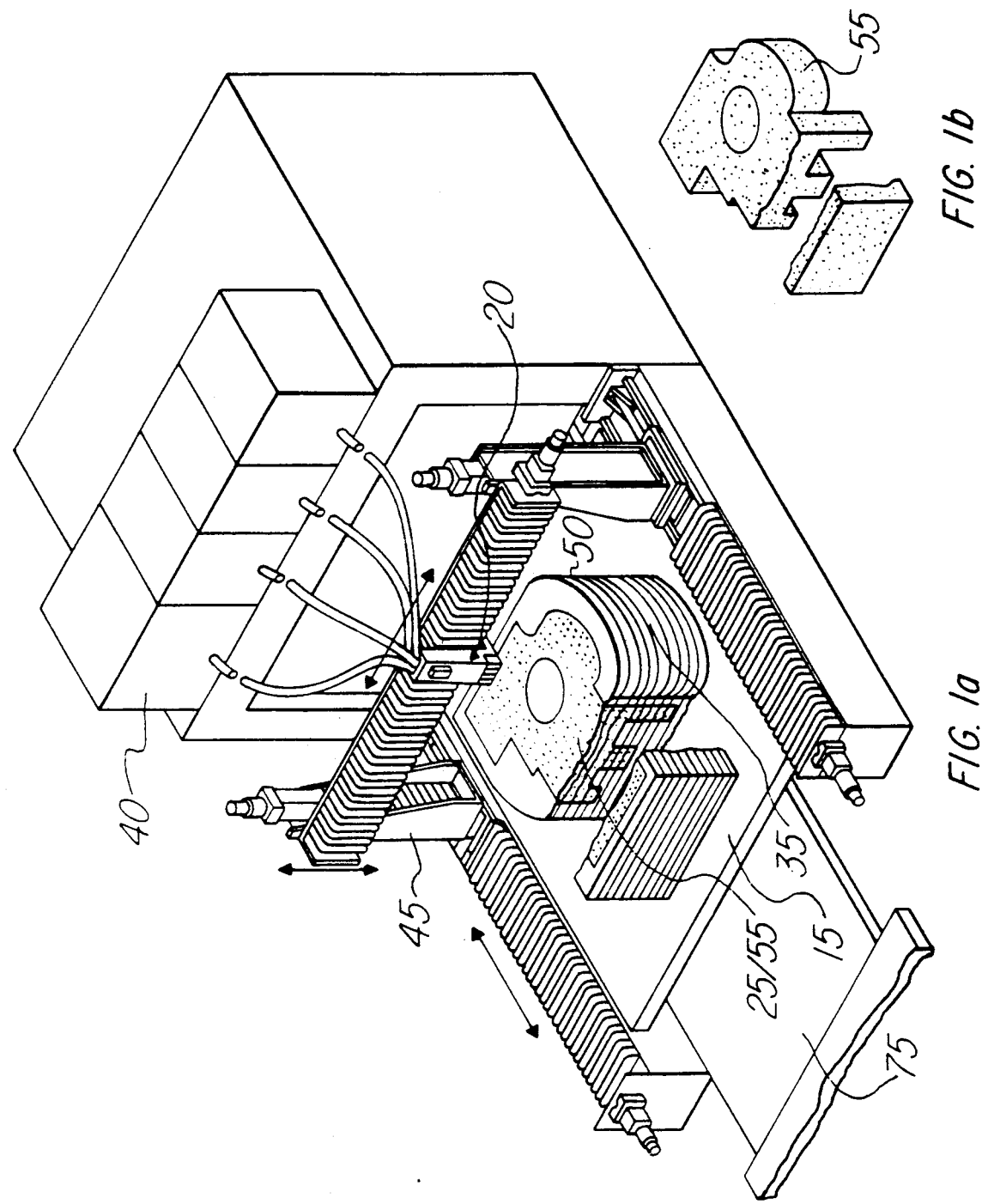
FIG. 1a is a perspective drawing of an automated three-dimensional object manufacturing station according to a preferred embodiment of the present invention.
FIG. 1b is a perspective drawing of an example three-dimensional object manufactured according to the present invention.

FIG. 1a is a perspective drawing of an automated threedimensional object manufacturing station according to a preferred embodiment of the present invention. One or more microprocessorcontrolled dispensing or printing devices (not shown), which comprise printhead 20, pump eutectic materials in liquid state, either as droplets or narrow streams, toward a generally planar target surface such as platform 15. Platform 15 serves as a base for the first, and subsequent, printing and spraying operations. Independent, computer-addressable dispensing devices are preferably inkjets, such as those on colored plotters or inkjet page printers, adapted to spray melted wax, plastic, or other material. Print devices within printhead 20 are turned on or off according to a two-dimensional data map stored and relayed by a microprocessor.

"Microcomputer" in some contexts is used to mean that microcomputer requires a memory and "microprocessor" does not. As used herein these terms can also be synonymous and refer to equivalent things. The phrase "processing circuitry" comprehends ASICs (application specific integrated circuits), PAL (programmable array logic), PLAs (programmable logic arrays), decoders, memories, nonsoftware based processors, or other circuitry, or digital computers including microprocessors and microcomputers of any architecture, or combinations thereof. Words of inclusion are to be interpreted as nonexhaustive in considering the scope of the invention.

An injection mold tool (not shown) is used for fabricating platform 15 from a water soluble material. The mold tool may have pressure or vacuum ports as well as cooling/heating mechanisms to accelerate the molding process. Additionally, the mold tool cavity may be of varying cross-sectional thickness depending on the geometry of the desired object. Platforms made of metal or other non-soluble materials such as ceramics or special plastics are less desirable than water soluble platforms because they diminish the area exposed to solvent during the wash phase.

Returning to FIG. 1a, one or more materials 25 are converted by heat or other process to a liquid state, and then ejected by printhead 20 to strike platform 15 where materials 25 rapidly solidify and adhere, thereby creating a two-dimensional pattern layer of varying cross-section. Several such layers formed sequentially on top of each other are known as a stack. It should be realized that although object 55, comprising a stack of layers of materials 25,35 deposited in accordance with microprocessor instruction, is portrayed in FIG. 1a with visible layers, this is done strictly for explanation and clarity. In practice, such layers are preferably 0.005 inch in depth and are virtually undetectable by the human eye.

Figure 2C:
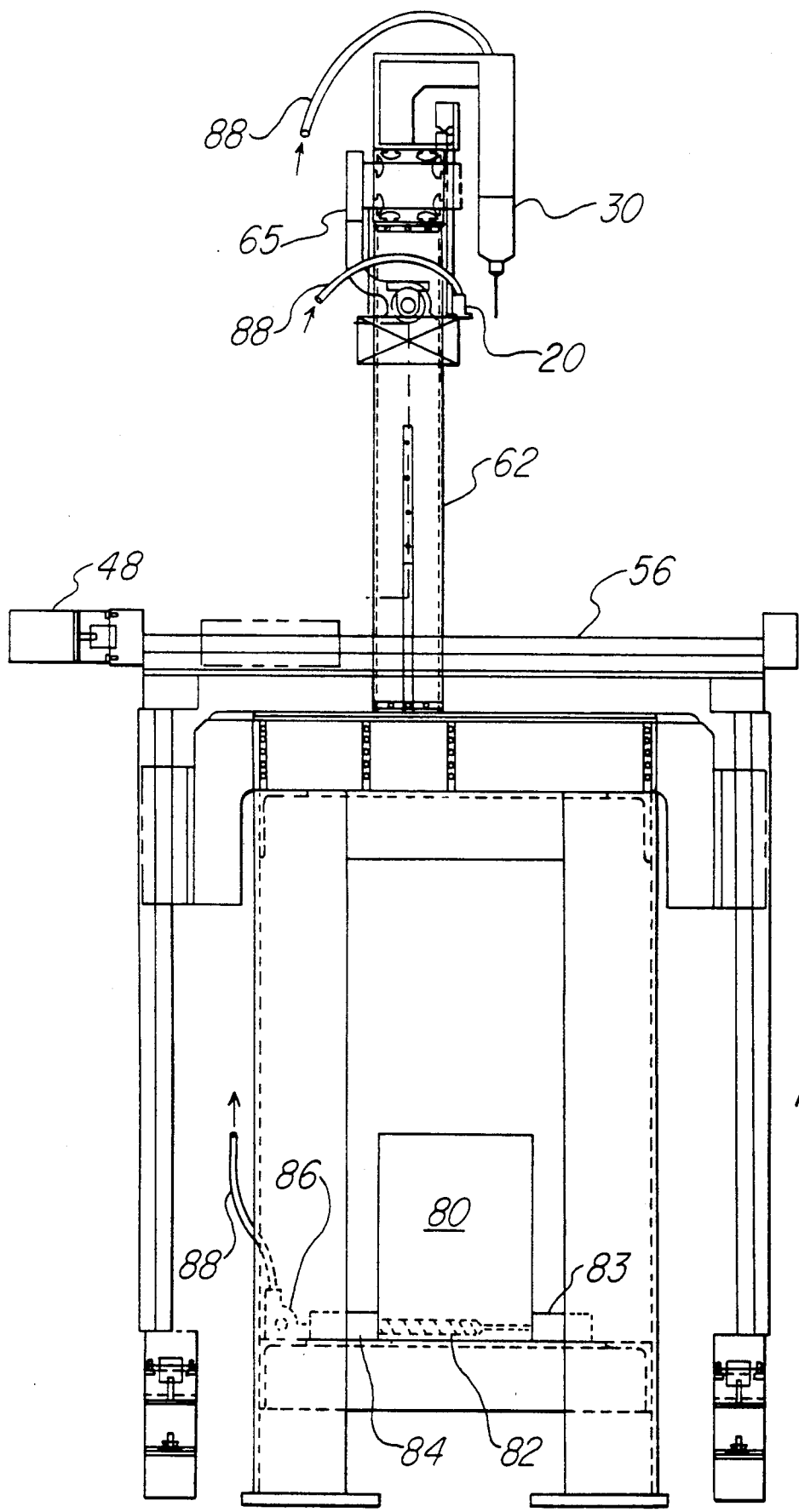

One or more heated nozzles or guns 30 (seen better in the embodiment of FIGS. 2a-c) spray a random coating, of preferably water soluble material 35, thereby encapsulating previously printed non-random, insoluble patterns. Material containment and delivery system 40, discussed in more detail in connection with FIGS. 2a-c, provides containers for each of materials 25,35 to be deposited according to the present invention. By using heated nozzles or guns 30 for dispensing of water soluble material 35, printhead 20 life is extended because it is not utilized for any water soluble material. Additionally, a significant reduction in computer data volume and processing is realized due to the use of random spray device(s) 30, which do not require detailed instructions to direct the sprayed particles to specific x,y points.

Water soluble material 35 is preferably solid at room temperature, exhibits a melted viscosity which is compatible with common paint spray type equipment, and has good machining characteristics after deposition and hardening. Material 35 supports and encapsulates the desired insoluble three-dimensional object during fabrication. As can be seen in FIG. 1b, the water dispersion characteristics of material 35 assures a very clean three-dimensional object 55, composed of only material 25, will remain after immersion in a container of water.

A water soluble material is preferred over the support materials used with other systems discussed previously, such as powders (tend to leave a rough, flaking surface) or UV-curable resin (must be removed manually with a cutting tool or sander). Powder support methods also do not provide adequate holding force against object warpage. The use of water soluble, or at least low melting point, materials enables users of the present invention, unlike other material deposition systems, to produce complex features such as cantilevers, or suspended objects from ceilings or walls, or even something, by way of example and not of limitation, as intricate and complex as a ship in a bottle. Additionally, water soluble materials are quite inexpensive and do not necessarily need to be printed with printhead 20, but can be quickly and cheaply sprayed on with nozzles 30.

Although using a water soluble material as a mold is preferred overall, it should be understood that material 35 could be a lowmelting point material which would then be removed by exposure to heat, or an alcohol-soluble material which would dissolve when immersed in alcohol. In general, dissimilar properties of the mold and object are exploited to remove the mold without affecting the object. Thus, when the final layer is printed, the support is melted or dissolved away, leaving the three-dimensional object intact, an example of which is seen in FIG. 1b. These materials, although frequently not as desirable as water soluble materials, are preferred to the support materials discussed above in connection with other material deposition systems, and use of such falls within the scope of the present invention.

Positioning devices 45, arranged along the X, Y, Z axes of a Cartesian coordinate system (and so labelled on FIG. 1a), move the printhead 20 and/or target surface 50 according to computer instructions. Target surface 50 is platform 15 for the initial deposition layer, and the previous deposition layer for any subsequent deposition layers. Specifically, positioning devices 45 can completely define any three-dimensional object, preferably by moving target surface 50 horizontally (Y) or vertically (Z), and by moving printhead 20 horizontally (X) across target surface 30. Positioning devices 45 employ circular motor 48 to move target surface 50, sprayers 30, and printhead 20. It should be noted that other motors, such as linear motors, could be used instead of circular motor 48.

It should be realized from the outset that positioning devices 45 could be a volumetric positioning device, or a planar positioning device operating together with a linear positioning device, or three linear positioning devices, etc., and such detail should in no way limit the scope of the invention.

FIGS. 2a–c are front, top, and left side views of another preferred embodiment of the rapid prototyping system of FIG. 1a according to the present invention. The description of elements shown in FIGS. 2a–c corresponding to those previously described in connection with the embodiment of FIG. 1a is hereby incorporated. As can be seen by comparing FIGS. 1a and 2a–c, the particular positioning of the elements of a system according to the present invention is immaterial, except that printhead 20 and sprayer(s) 30 are preferably positioned to dispense materials perpendicularly onto target surface 50.

The prototyping system shown in FIGS. 2a–c rests on a supporting table 56. Cantilever supports 58 strengthen supports 62 to fortify lintel support 64 from which printhead(s) 20, sprayer(s) 30, etc. hang.

One or more cutting devices 60 (best seen in FIG. 2a), arranged so as to plane the uppermost surface of target surface 50 at specified intervals along the vertical axis of fabrication, remove a portion of water soluble encapsulant 35 and expose underlying insoluble material 25 for new pattern deposition. Cutting device(s) 60 also compensates for surface and height variations caused by flow rate differences among multiple print devices 10 on printhead 20. Warpage of the object is also reduced because the planing action of cutting device(s) 60 serves to relieve stresses induced by material 25,35 cooling and shrinking.

Vacuum head and pumping system 65 (best seen in FIG. 2c) removes residue generated during the planing action of cutting device(s) 60. The residue can be recovered in a filtered canister (not shown) for disposal or further recycling. Vacuum fixture 70 (best viewed in FIG. 2a) holds building platform 15 to positioning devices 45 and permits simple, rapid removal and replacement of platform 15 without risk of damage or deformation to platform 15. Vacuum fixture 70 further enables a system according to the present invention to provide an optional automated object-in, object-out conveyor or rack 75 (shown in FIG. 1a).

Work volume 78, outlined in dashed lines in FIG. 2a, indicates the maximum object envelope in which an object may be situated as it is being printed. Because some material combinations require printing at ambient temperatures above room temperature (as with metals) or well below (as with water), an environmentally-controlled chamber can be positioned within work volume 78.

Bulk containers 80 (best seen in FIG. 2c), part of material containment and delivery system 40 of FIG. 1a, store dry, solid volumes of process material 25,35 which are then conveyed and metered by feed device 82 into corresponding smaller, heated chambers 84 where melting and filtering occurs. Feed device 82 might be of an auger or screw feed device, although other feed devices are possible, and is driven by motor 83. The ensuing melted liquid media is pressurized by pressure devices 86, each of which could be a pump or the like, prior to delivery via liquid media feed lines 88 to printhead 20 or spray gun 30. Liquid media feed lines 88 are shown with a break; this is for clarity, as each of lines 88 continue from pressure devices 86 to either printhead 20 or sprayer(s) 30, depending upon the line.

Thus, in addition to shape-rendering, a system according to the present invention uniquely enables an object to be fabricated with high resolution color features. Beneficiaries of this unique aspect include the medical, geological, architectural, and engineering fields, as well as the arts, astronomy, and many other disciplines. Material(s) 25 may be of different material colors or color combinations, as well as different material composition. To achieve any desired level of visual realism, the colors cyan, magenta, yellow, black, and white are preferred since any intermediate hue of the full color spectrum can be obtained by material overlap or dithering.

Figure 3:
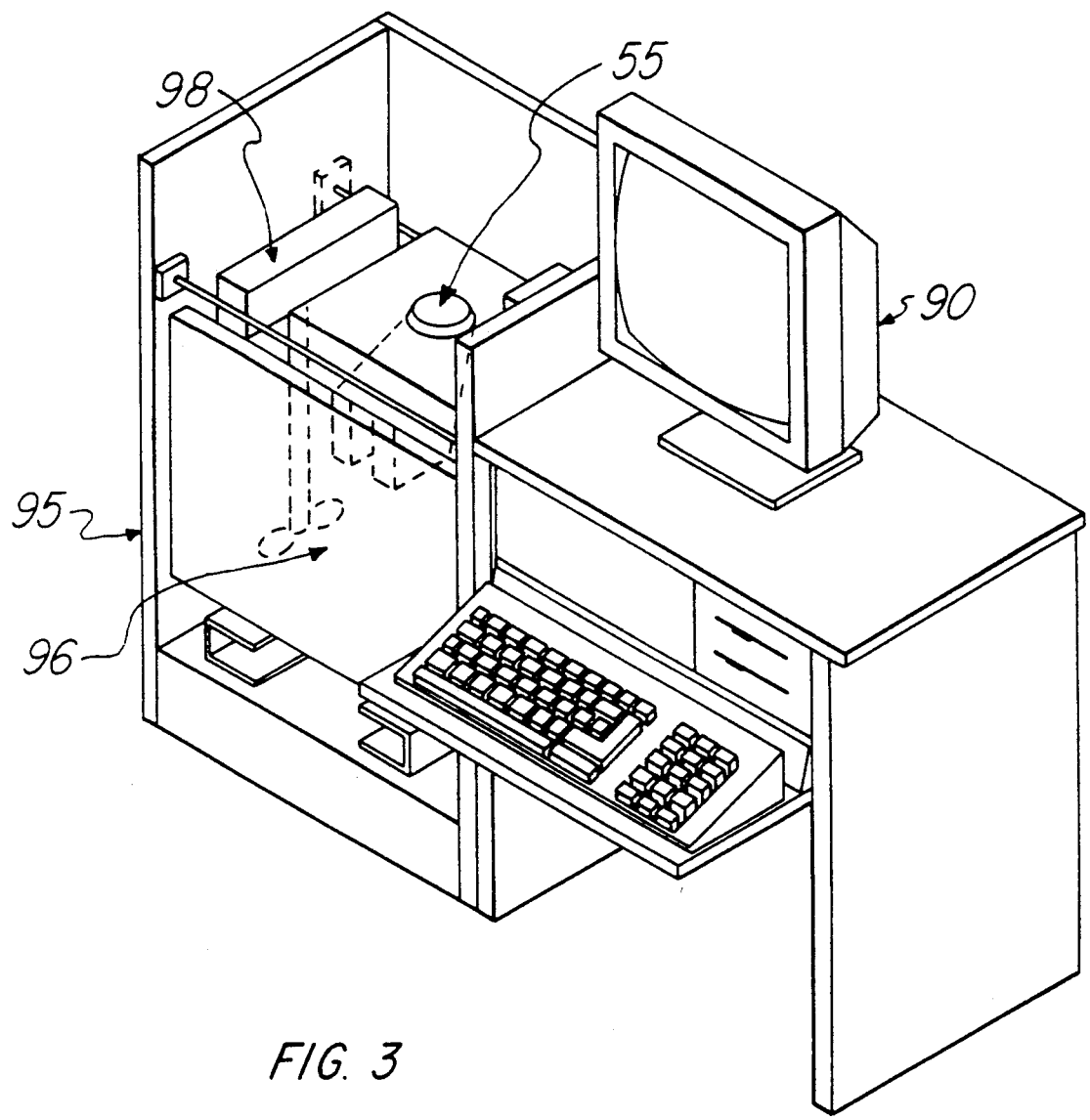
FIG. 3 is a perspective view of a microprocessor and water rinse vat according to a preferred embodiment of the present invention.

FIG. 3 is a perspective view of a microprocessor and a support removal system according to a preferred embodiment of the present invention. Microprocessor control system 90 and support removal system 95 are shown at a work station. Although not shown, such control and support removal systems could be arranged differently and could be physically combined with the systems depicted in FIGS. 1a or 2a–c to provide a fully-automated rapid prototyping system.

A CAD system is used to generate and store specific data, including dimensions, color, or other desired properties, which simulate desired three-dimensional physical objects. This data is sent to, stored, and processed by microprocessor control system 90. Microprocessor control system 90 contains, microprocessor instructions, as well as image processing and data conversion code to process the input data into sequential cross-sections of the three-dimensional object to be physically rendered.

The system, method, and process for computer-controlled manufacturing of desired three-dimensional objects involves dispensing layers of liquid materials 25,35 onto target surface 50 at predetermined locations. These predetermined locations are established by microprocessor control system 90 based on the processed slice data received from a computer image file in the CAD system. Microprocessor control system 90 also controls the sequence and timing of the system, method, and process operations as well as the electro-mechanical components for material conveyance, feedback sensors, and system processes.

It should be realized that microprocessor control system 90 could also encompass the CAD system, or any other desired object scanning and image capture device, rather than having this function performed by separate systems.

Support removal system 95 consists of rinse vat 96 of sufficient size to fully contain a volume of solvent and object 55 on which the solvent will act. Circulation pump or stirrer 98 may be integrated to accelerate the dissolving process and carry away residue. The solvent is water when the mold material 35 to be removed is water soluble, etc.

Support removal system 95 could instead comprise temperature chamber 96 into which object 55 is placed. Air circulator 98 may be integrated in such chamber 96 to accelerate the dissolving process. This latter system could be best employed when mold material 35 melts at a lower temperature than object material 25. This allows selective removal of the mold when exposed to a temperature greater than the melting point of the mold and less than the melting point of the object. A wide range of material 25,35 combinations are possible such as water and wax, wax and plastic, plastic and metal, and so on. In many cases mold and object materials 25,35 can be recycled for repeated use, thereby reducing waste.

Figure 4:
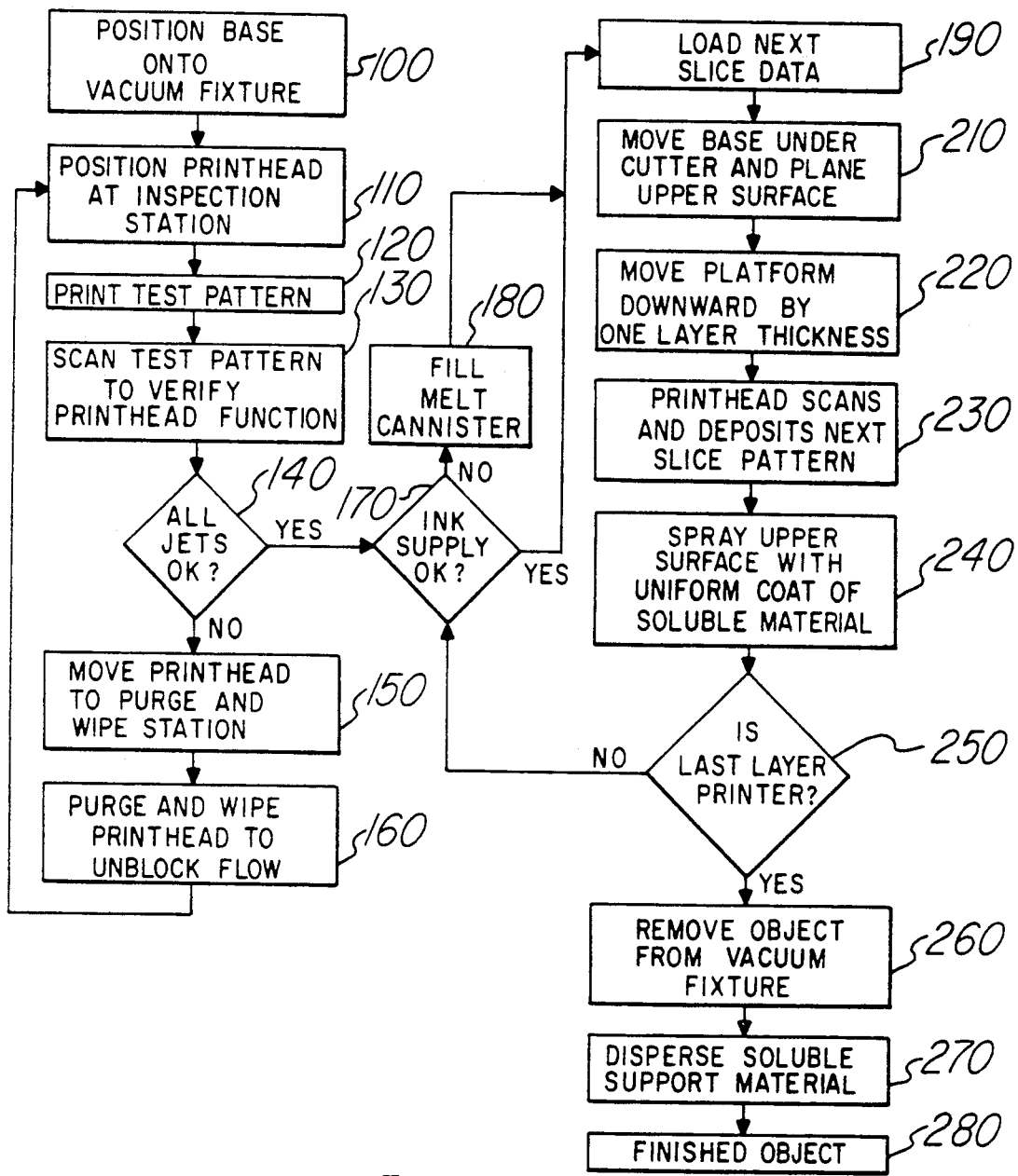
FIG. 4 is a process flow diagram depicting a process of manufacturing a three-dimensional object according to a preferred embodiment of the present invention.

FIG. 4 is a process flow diagram depicting a process of manufacturing a three-dimensional object according to a preferred embodiment of the present invention. Once the platform for the object is positioned onto the vacuum fixture (Block 100), the printhead jets are checked to see if they are all functioning. This is accomplished by positioning printhead 20 so its output is viewable to the optical inspection station (Block 110). The printhead jets then print a pattern of short line segments (Block 120) which are scanned to verify whether each of the jets are functioning properly (Block 130). If all of the jets are determined to not be operating properly, printhead 20 is moved to the purge and wipe station (Block 150) where the system is purged to unblock the flow of the jets (Block 160). Printhead 20 is then returned to the optical inspection station (Block 110), where the jets are again checked (Blocks 120 and 130). Although it is not shown in the process of FIG. 4, it should be apparent that printhead 20 could be checked as often as desired.

If all of the jets are operating properly (Block 140), the ink supply is checked (Block 170). If the supply is found to be inadequate, the melt canister is filled from the bulk canister (Block 180). Once the ink supply is sufficient, the process continues by loading the object's slice data (Block 190).

The object's slice data is generated from a three-dimensional computer "object" image including color information is converted by application software to a vertical sequence of two-dimensional patterns. Although a second image could be software generated in the form of a negative volume around the first image, the "mold" image converted to a set of two-dimensional slices and the slice data of the object and mold then combined in sequential order, a second image is not necessary or preferred. The global action of sprayers 30 allow for accurate printing with only the object's image.

Once the first slice data is loaded (Block 190), platform 15 is positioned so cutting device(s) 60 can plane its upper surface (Block 210) and platform 15 is lowered by one layer's thickness (Block 220). Printhead 20 then scans and deposits the slice pattern according to the slice data received (Block 230). The first layer's slice data determines print head position above platform 15 along with appropriate ejector function at that location. Printhead 20 moves in a plane parallel to platform 15 until the layer is complete. Once the printing of the first slice's pattern is completed, sprayers 30 spray the upper surface of target surface 50 with a uniform layer of soluble support material 35 (Block 240).

Although loading the next slice data is shown in the process flowchart before the planing step, it can occur after the planing step or preferably, simultaneously with the planing step. In fact, microprocessor control system 90 may load the next slice data at any time during the print cycle when most expeditious.

If this is not the last layer to be printed (Block 250), the ink supply is again checked (Block 170) and ink added if needed (Block 180). The next slice data is loaded (Block 190) while platform 15 is positioned so cutting device(s) 60 can plane the upper surface of target surface 50 (Block 210). Platform 15 is then moved downward by one layer thickness (Block 220) and the next layer printed (Blocks 230,240). If this is the last layer to be printed (Block 250), the part is removed from the vacuum fixture (Block 260) and immersed in a solvent, preferably water, to dissolve the soluble support material (Block 270). This process yields the completed three-dimensional object (Block 280)

In an example of preferred process according to the present invention, liquid wax at 140 degF (material 25) is jet-printed in sequential layers to form the object pattern. Simultaneously, sequential layers of ice (material 35) are jet-printed around the object pattern to form a frozen mold. The combined solid mass of materials 25, 35 is then heated to melt the mold portion only, leaving a high resolution, recyclable casting pattern. Many other materials 25,35 combinations are possible, limited only by the imagination of those skilled in the art.

Figure 5:
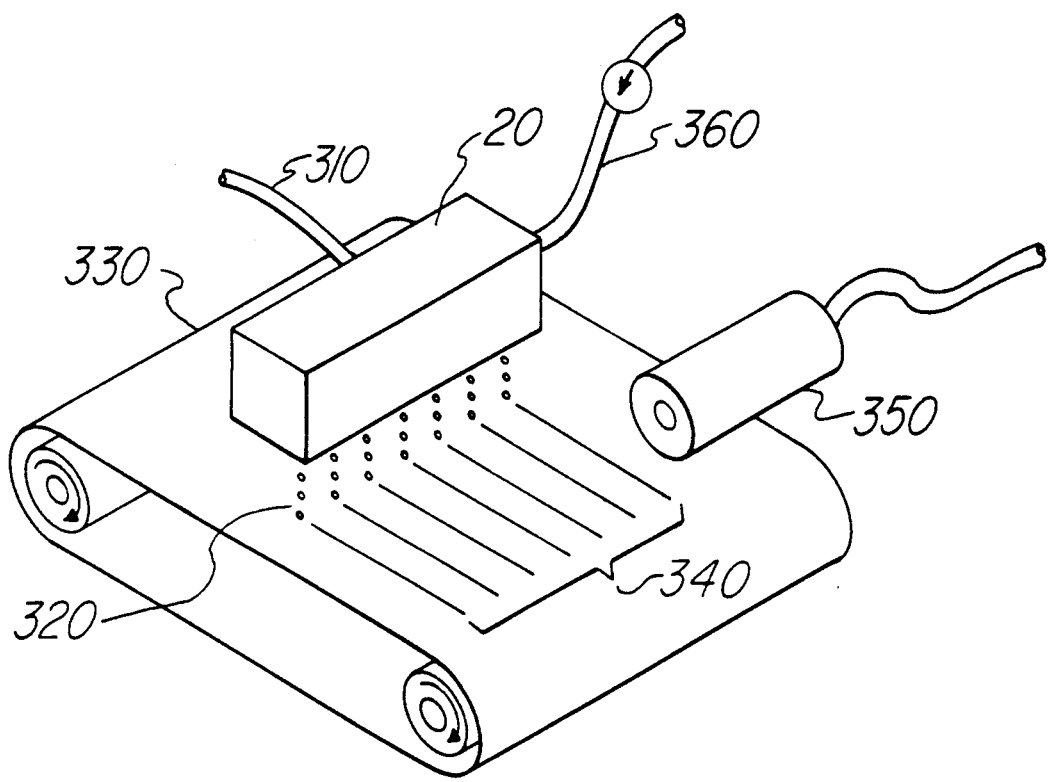
FIG. 5 is a perspective view of a printhead inspection and purging station according to a preferred embodiment of the present invention.

FIG. 5 depicts a printhead inspection and purging station according to a preferred embodiment of the present invention. Printhead 20 receives melted media via media feeder tube 310 and deposits drops 320 of such media onto conveyor belt 330 in the form of short parallel lines 340. The surface of conveyor belt 330 is preferably made of paper. Optical sensor 350 scans parallel lines 340 printed by simultaneous operation of all printing devices or jets 10 (not visible from the drawing) of printhead 20. The microprocessor responds to any output of optical sensor 350 indicating at least one malfunctioning print device by directing printhead 20 away from conveyor belt 330 to complete a purge-and-wipe for expulsion of any foreign matter. Air is forced into printhead 20 via purge valve-monitored air tube 360. This effectively purges the foreign matter from any malfunctioning print device 10 on printhead 20. Printhead 20 is then wiped off (not shown) and repositioned over conveyor belt 330. Printhead 20 again deposits fresh media drops 320 onto conveyor belt 330 in the form of short parallel lines 340 which are scanned by optical sensor 350. This procedure repeats until all print devices 10 on printhead 20 are properly functioning. Although an inspection system employing an optical sensor is discussed as preferable, various other inspection systems will occur to those skilled in the art.

Figure 6A:
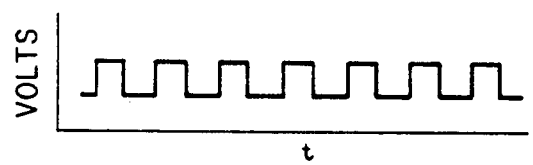
FIGS. 6a-b are waveform diagrams reflecting detector output according to a preferred embodiment of the present invention.
Figure 6B:
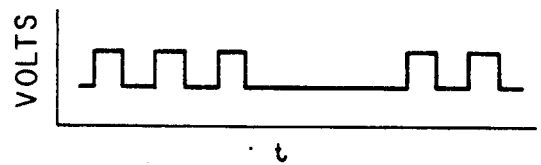

FIGS. 6a-b depict waveform diagrams reflecting the output of optical sensor 350 according to a preferred embodiment of the present invention. In these diagrams, square waveforms accurately show the number of jets functioning. The lack of a square waveform where there should be one indicates a malfunctioning jet. FIG. 6a details the output from optical sensor 350 with all of the jets functioning, while FIG. 6b shows a waveform consonant with two jets malfunctioning.

Figure 7A:
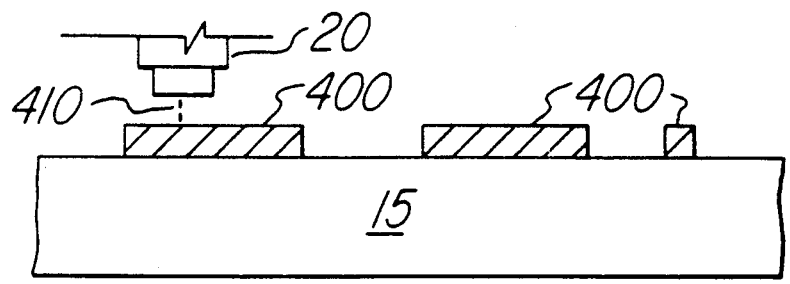
FIGS. 7a-c depict views of the resulting structure during selected process steps for manufacture of a three-dimensional object made of a low melting point material according to the preferred embodiment of the present invention of FIG. 4.
Figure 7B:
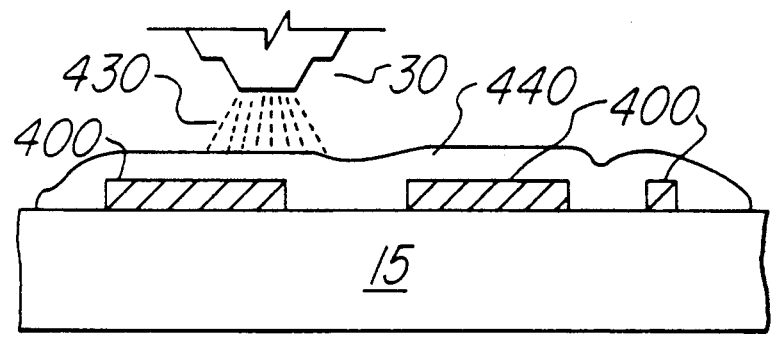
Figure 7C:
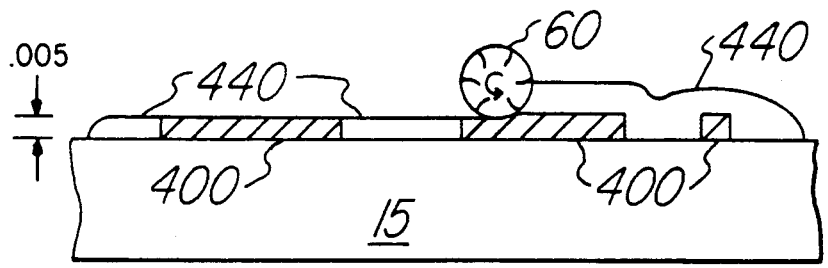

FIGS. 7a-c depict views of the resulting structure during process steps 230, 240, and 210, respectively, for manufacture of a three-dimensional object to be made of a low melting point material such as wax, according to the preferred embodiment of the present invention of FIG. 4. FIG. 7a shows printhead 20 depositing drops 410 of wax to form a wax layer 400 at specific locations on soluble platform 15 as determined by the microprocessor control system according to the CAD image. Such layer 400, regardless of composition, is known as the positive material and, when all layers are completed, will form the desired threedimensional object.

In FIG. 7b sprayer 30 sprays droplets 430 of water soluble mold material 440 to encapsulate deposited wax layer 400 residing on soluble platform 15. Material 440, regardless of composition is known as the negative material and, when all layers are completed, will form the mold. A unique feature of FIG. 4's process is seen in FIG. 7b, namely that the sprayed negative material 440 is random, such that spray particles are not directed by computer to specific x,y points.

To prepare the surface for subsequent layers, a mill cutter or other cutting device(s) 60 removes some of the previous layer thickness to expose the positive material 400. FIG. 7c depicts cutter 60 planing water soluble mold material 440 to expose deposited wax layer 400. This step also defines the thickness of each layer and compensates for different inkjet dispensations. After all layers are processed, negative material 440 is selectively removed by solvent, not shown, leaving positive material 400, wax in this case, intact.

Certain materials may be too viscous to be used in inkjet type mechanisms. These materials may, however, exhibit desirable properties such as durability, appearance, or solubility in water. A desired use for such viscous material, intended only as an example and not by way of limitation, might include circuit assemblies manufactured from conductive media such as pastes and epoxies.

To utilize high melting point or high viscosity materials, atomizing nozzles and pressurized guns, such as those used for painting, can be used as an alternative to inkjet type print-heads. Such nozzles or guns can employ pressurized syringes or piston-type action, and are available with various nozzle diameters.

Figure 8A:
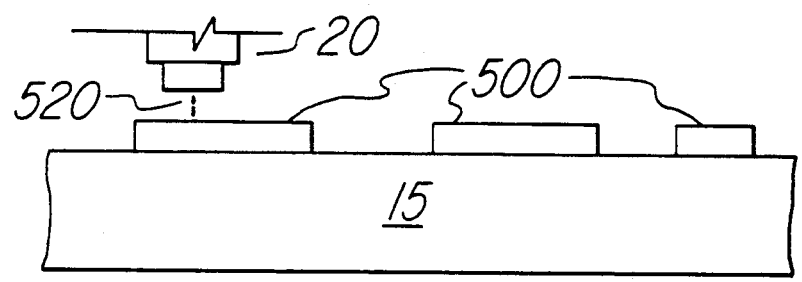
FIGS. 8a-c depict views of the resulting structure during selected process steps for manufacture of a three-dimensional object made of a high melting point or high viscosity material according to a preferred embodiment of the present invention of FIG. 4.
Figure 8B:
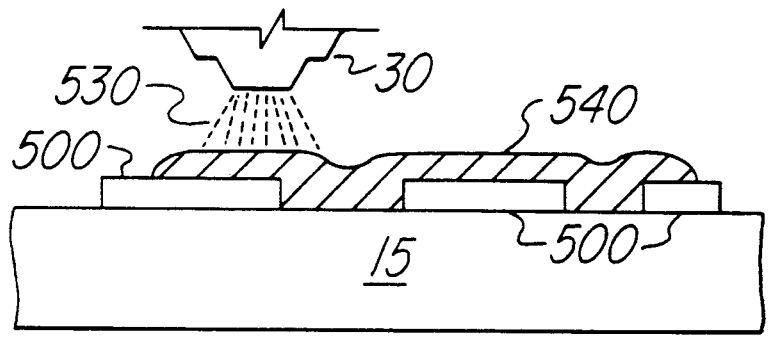
Figure 8C:
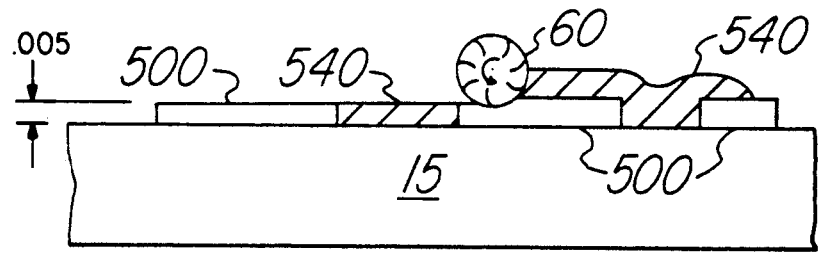

FIGS. 8a-c depict views of the resulting structure during process steps 230, 240, and 210, respectively, for manufacture of a three-dimensional object to be made of a high melting point or high viscosity material, according to the preferred embodiment of the present invention of FIG. 4. It is understood that such high melting point or high viscosity material can be metal, ceramic, plastic, paste, epoxy, etc., as well as a combination or alloy of such materials, such as tin-lead alloy as an example and not by way of limitation.

FIG. 8a shows inkjet printhead 20 depositing drops 520 of wax to form a wax layer 500 at specific locations on platform 15 as determined by the microprocessor control system according to the CAD image. Such layer 500, regardless of composition, is the negative material and, when all layers are completed, will form the mold or support.

In FIG. 8b sprayer nozzle or gun 30 sprays droplets 530 of high melting point or high viscosity material 540 over the support material 500 and any pattern cavities therein. Material 540, regardless of composition is the positive material and, when completed, will form the desired three-dimensional object. A unique feature of FIG. 4's process is seen in FIG. 8b, namely that the sprayed positive material 540 is random, such that spray particles are not directed by computer to specific x,y points.

To prepare the surface for subsequent layers, a mill cutter or other device removes some of the previous layer thickness to expose the positive material. FIG. 8c depicts cutter 60 planing positive material 540 to expose deposited wax layer 500. Each layer is milled to a prescribed thickness which compensates for different nozzle dispensations. After all layers are processed, the final volume consists of a high melt-point or high viscosity object with a low melt-point mold. The negative material 500 is selectively removed by solvent or heat, not shown, leaving the high melting point or high viscosity positive material 540 intact.

This approach is unique in that it enables objects to be made of many more materials, such as nylon, PVC, or even metal alloys to name a few, which could not be possible using inkjet printer mechanisms alone. Furthermore, milling the upper surface of deposited layers serves to relieve stress which, for other systems, causes part warpage. Also, the number of inkjet printheads required is reduced, since much of the material is sprayed randomly while providing sufficient broad area coverage.

The simplicity of a system, method, and process according to the present invention offers many advantages. The printheads are small, inexpensive and can be configured to several scan methods, including vector and raster. Ejector apertures are small, enabling very high resolution. Furthermore, wide apertures or ejector arrays can be utilized for high volume dispensing, as well as dispensing of high viscosity materials. Additionally, a system, method, and process according to the present invention can be tailored to various work environments and applications ranging from foundries and machine shops to small desktop systems. Because the media can be printed on any surface, automated conveyor and material handling systems can be incorporated. This enables fast and continuous throughput from multiple data sources. This includes multiple computer-generated images, on at least one computer, being rapidly prototyped by one or more systems built according to the teachings of the present invention.

Some of the innumerable objects which can be produced by this technique include prototypes, casting patterns, molds, sculptures, and structural components. It will quickly be apparent to those skilled in the art that this list is in no way exhaustive and that numerous other uses of the present invention will occur to those skilled in the art.

It should be understood that various embodiments of the invention can employ or be embodied in hardware, software or microcoded firmware. Process diagrams are also representative of flow diagrams for microcoded and software based embodiments. Further, while a specific embodiment of the invention has been shown and described, various modifications and alternate embodiments will occur to those skilled in the art. Accordingly, it is intended that the invention be limited only in terms of the appended claims.

I claim:

1. A computer-controlled method for manufacturing of three-dimensional objects, comprising the steps of:
   a. dispensing a layer of a first material at selected locations of a target surface, said selected locations corresponding to a cross-section of a three-dimensional object, wherein said first material is dispensed in liquid form and hardens once so dispensed;
   b. dispensing a second material over said layer of said hardened first material to encapsulate said hardened first material;
   c. planing the surface of said encapsulating second material;
   d. dispensing another layer of said first material onto said planed uppermost surface at selected locations corresponding to another cross-section of said three-dimensional object;
   e. repeating steps b-d to form said three-dimensional object; and f. selectively removing said second material relative to said first material to yield said three-dimensional object formed of said hardened first material.

2. The process of claim 1, wherein said step of planning comprises the steps of:
   removing a portion of the second material and exposing the underlying first material so that the subsequently dispensed portions of said first material thereover will bond thereto.

3. The process of claim 1, further comprising:
   after said step of planning, removing residue resulting from said planing step.

4. The process of claim 1, further comprising:
   determining said selected locations corresponding to cross-sections of three-dimensional object by operating a control system to receive, store and process data describing the dimensions of said three-dimensional object.

5. The process of claim 1, wherein said target surface comprises a water soluble platform.

6. The process of claim 1, wherein said layers of said first material are of a plurality of colors.

7. The process of claim 1, wherein selected portions of a single layer of said first material are of a plurality of colors.

8. A process for producing a three-dimensional object from a computer data base, comprising the steps of:
   a. loading data corresponding to a first slice of said object into a controller;
   b. providing a target surface over a platform;
   c. dispensing a layer of first material onto said target surface at locations established according to said loaded first slice data and controlled by said controller, wherein said first material hardens once so dispensed;
   d. spraying a second material to encapsulate said layer of hardened first material;
   e. loading data corresponding to a next slice of said object into said controller;
   f. planing the uppermost surface of said encapsulated layer of hardened first material;
   g. after step f, dispensing another layer of said first material onto said planed surface of said encapsulated layer at locations established according to said loaded next slice data and controlled by said controller;
   h. repeating steps d-g to form an object of said hardened first material within a said second material and
   i. dissolving said second material is a solvent in which said second material is substantially more soluble than said first material to recover said object.

9. The process of claim 8, wherein said step of planning comprises the step of:
   removing a portion of said encapsulating second material to expose said hardened first material thereunder.

10. The process of claim 8, wherein said slice data comprises sufficient data to simulate an image generated by an object scan and image capture device, including dimensions, color, texture or composition.

11. The process of claim 8, wherein said second material is water soluble.

12. The process of claim 8, further comprising:
   after said step of planing, removing residue resulting from said planing step.

13. A system for manufacturing three-dimensional objects from computer data comprising:

a substantially planar target surface;

a controlled dispensing device for repeated dispensing of a first material in a liquid state onto said target surface at selected locations corresponding to a cross-section of an object to be manufactured;

a dispensing device for repeated spraying of soluble material to encapsulate said first material;

a cutting device for planarizing said encapsulated first material in preparation for receiving additional dispensing of said first material; and a support removal system for selectively removing said soluble material relative to said first material.

14. The system of claim 13, wherein said target surface comprises a soluble platform.

15. The system of claim 13, wherein said controlled dispensing device is controllable in such a manner that it is turned on and off according to a two dimensional data map stored in a microprocessor.

16. The system of claim 13, wherein said controlled dispensing device is for dispensing a plurality of materials of the same composition but having different colors.

17. The system of claim 13, wherein said controlled dispensing device is for dispensing a plurality of materials of different composition and different color.

18. The system of claim 13, wherein said controlled dispensing device is for dispensing a plurality of materials of different composition but the same color.

19. The system of claim 1, further comprising the step of establishing said selected locations by operating a microprocessor control system to receive store and process data describing the desired color of said three-dimensional object.

20. The system of claim 1, further comprising the step of establishing said selected locations by operating a microprocessor control system to receive, store and process data describing the desired composition of said three-dimensional object.

21. The system of claim 1, further comprising the step of establishing said selected locations by operating a microprocessor control system to receive, store and process data describing the desired texture of said three-dimensional object.

22. A method for manufacturing a three dimensional object, comprising the steps of:
   dispensing a first layer of a first material in liquid form at selected locations of a substantially planar first target surface, said selected locations corresponding to a first cross-section of an object, wherein the first material solidifies after being dispensed;
   applying a second material at locations of said first target surface adjacent said first layer of said first material by encapsulating said first layer of said first material with said second material and planarizing the surface of the encapsulated second layer to form a second target surface, to form a substantially planar second target surface;
   dispensing a second layer of said first material at selected locations of the surface of said second target surface, said selected locations corresponding to a second cross-section of the object;
   applying said second material at locations of said second target surface adjacent said second layer of said first material by encapsulating said second layer of said first material with said second material and planarizing the surface of the encapsulated second layer to form said second target surface, to form a substantially planar third target surface; and selectively removing said second material relative to said first material leaving an object formed of said first material.

23. The method of claim 22, wherein said removing step comprises:
melting said second material at a temperature below the melting point of said first material.

24. The method of claim 22, wherein said removing step comprises:
dissolving said second material with a solvent in which said first material is substantially insoluble.

25. The method of claim 22, wherein said removing step comprises:
subjecting the object to a process by which said first material is unaffected.

26. The method of claim 22, wherein said first target surface is a platform.

27. The method of claim 25, wherein said platform is of a material which may be removed selectively relative to said first material.

28. The method of claim 22, wherein said first material solidifies by cooling after being dispensed.

29. The method of claim 22 further comprising:
before said step of selectively removing, repeating each of said steps of dispensing and applying.

30. The method of claim 22, wherein at least one of said selected locations of said second target surface at which said second layer of said first material is dispensed overlies said second material.

* * * * *